(12) United States Patent
Bowers et al.

(10) Patent No.: US 8,830,653 B2
(45) Date of Patent: *Sep. 9, 2014

(54) GRAPHENE MOUNTED ON AEROGEL

(71) Applicant: Elwha LLC, Bellevue, WA (US)

(72) Inventors: Jeffrey A. Bowers, Bellevue, WA (US); Alistair K. Chan, Bainbridge Island, WA (US); Geoffrey F. Deane, Bellevue, WA (US); Roderick A. Hyde, Redmond, WA (US); Nathan Kundtz, Kirkland, WA (US); Nathan P. Myhrvold, Medina, WA (US); David R. Smith, Durham, NC (US); Lowell L. Wood, Jr., Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/010,739

(22) Filed: Aug. 27, 2013

(65) Prior Publication Data
US 2014/0000805 A1    Jan. 2, 2014

Related U.S. Application Data

(63) Continuation of application No. 13/398,561, filed on Feb. 16, 2012, now Pat. No. 8,593,783.

(51) Int. Cl.
| | |
|---|---|
| H01G 4/008 | (2006.01) |
| H01G 4/06 | (2006.01) |
| B32B 9/00 | (2006.01) |
| H01L 29/786 | (2006.01) |
| B32B 37/14 | (2006.01) |
| H01G 4/002 | (2006.01) |
| H05K 3/00 | (2006.01) |
| H05K 1/02 | (2006.01) |
| H01G 4/005 | (2006.01) |
| B32B 5/18 | (2006.01) |
| B82Y 30/00 | (2011.01) |
| H01L 29/16 | (2006.01) |

(52) U.S. Cl.
CPC . *B32B 5/18* (2013.01); *B32B 9/007* (2013.01); *H05K 2201/0323* (2013.01); *B82Y 30/00* (2013.01); *H01L 29/78603* (2013.01); *B32B 37/14* (2013.01); *H01G 4/002* (2013.01); *H05K 3/00* (2013.01); *H05K 1/02* (2013.01); *H01L 29/1606* (2013.01); *H01G 4/005* (2013.01); *Y10S 977/734* (2013.01)
USPC ............................ 361/305; 361/311; 977/734

(58) Field of Classification Search
USPC .......................................... 361/502; 977/734
See application file for complete search history.

(56) References Cited

U.S. PATENT DOCUMENTS 5,260,962 A * 11/1993 Hotaling ......................... 372/94
5,300,807 A * 4/1994 Nelson ......................... 257/632

(Continued)

FOREIGN PATENT DOCUMENTS

| | | | |
|---|---|---|---|
| EP | 1931186 A1 | * | 6/2008 |
| JP | 2009091174 A | * | 4/2009 |
| WO | WO 2012138803 A2 | * | 10/2012 |

OTHER PUBLICATIONS

Kim et al, Large-scale pattern growth of graphene films for stretchable transparent electrodes, Feb. 2009, nature, vol. 457, pp. 706-710.*

*Primary Examiner* — David M Sinclair
(74) *Attorney, Agent, or Firm* — Foley & Lardner LLP

(57) ABSTRACT

An apparatus having reduced phononic coupling between a graphene monolayer and a substrate is provided. The apparatus includes an aerogel substrate and a monolayer of graphene coupled to the aerogel substrate.

39 Claims, 14 Drawing Sheets

(56) References Cited

U.S. PATENT DOCUMENTS

| | | | |
|---|---|---|---|
| 5,561,318 A * | 10/1996 | Gnade et al. | 257/638 |
| 7,715,667 B2 * | 5/2010 | Lee et al. | 385/14 |
| 7,723,684 B1 | 5/2010 | Haddon et al. | |
| 8,278,757 B2 | 10/2012 | Crain et al. | |
| 8,593,783 B2 * | 11/2013 | Bowers et al. | 361/305 |
| 2010/0116691 A1 | 5/2010 | Papadimitrakopoulos et al. | |
| 2010/0144904 A1 | 6/2010 | Wang et al. | |
| 2010/0283957 A1 | 11/2010 | Matera et al. | |
| 2011/0278545 A1 * | 11/2011 | Voutilainen et al. | 257/29 |
| 2012/0058350 A1 * | 3/2012 | Long et al. | 428/446 |
| 2012/0128983 A1 * | 5/2012 | Yoon et al. | 428/408 |

* cited by examiner

GRAPHENE MOUNTED ON AEROGEL

CROSS-REFERENCE TO RELATED APPLICATIONS

For purposes of the USPTO extra-statutory requirements, the present application constitutes a continuation of U.S. patent application Ser. No. 13/398,561, entitled GRAPHENE MOUNTED ON AEROGEL, naming JEFFREY A. BOWERS, ALISTAIR K. CHAN, GEOFFREY F. DEANE, RODERICK A. HYDE, NATHAN KUNDTZ, NATHAN P. MYHRVOLD, DAVID R. SMITH, LOWELL L. WOOD, JR. as inventors, filed Feb. 16, 2012, which is currently co-pending and which is herein incorporated by reference in its entirety.

BACKGROUND

The present application relates generally to the field of mechanical supports for graphene sheets. The present application relates more specifically to the field of graphene sheets mounted on aerogel substrates.

Phononic coupling between graphene and a supporting substrate can markedly reduce its in-plane electron mobility. For example, freestanding graphene has a mu value of approximately 200,000 $cm^2$/V-sec. However, direct mounting on a silicon substrate can reduce this value to approximately 1000 $cm^2$/V-sec. Thus, there exists a need for an improved mechanical support for a graphene film.

SUMMARY

One embodiment relates to an apparatus having reduced phononic coupling between a graphene monolayer and a substrate. The apparatus includes an aerogel substrate and a first monolayer of graphene coupled to the aerogel substrate.

Another embodiment relates to a system having preserved electronic properties in a supported graphene sheet. The system includes a graphene sheet supported by an aerogel substrate, the graphene sheet including one or more devices.

Another embodiment relates to a method of reducing phononic coupling between a graphene monolayer and a substrate. The method includes providing a substrate formed of aerogel and placing a monolayer film of graphene in contact with the substrate.

Another embodiment relates to a method of preserving electronic properties in a mechanically supported graphene sheet. The method includes providing a substrate formed of aerogel, providing a graphene film having one or more devices disposed thereon, and disposing the graphene film on the substrate.

Another embodiment relates to a method of forming a circuit board. The method includes providing a graphene film having one or more devices disposed thereon, providing a substrate formed of aerogel, the substrate having a first side and a second side opposite the first side, disposing a first portion of the graphene film on the first side of the substrate, and disposing a second portion of the graphene film on the second side of the substrate.

Another embodiment relates to a circuit board. The circuit board includes a first substrate formed of aerogel, the first substrate comprising a first side and a second side opposite the first side, and a graphene film having a first portion and a second portion and having one or more devices disposed thereon. The first portion of the graphene film is disposed adjacent the first side of the substrate, and the second portion of the graphene film is disposed adjacent the second side of the substrate.

The foregoing is a summary and thus by necessity contains simplifications, generalizations and omissions of detail. Consequently, those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

DETAILED DESCRIPTION

Figure 1:
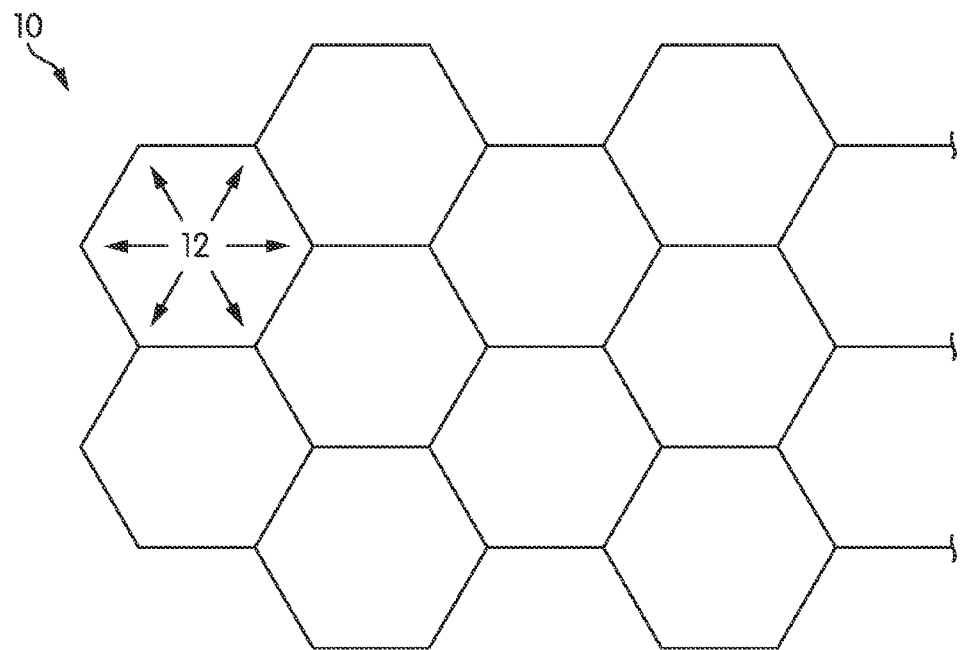
FIG. 1 is a schematic plan view of a portion of a graphene sheet, shown according to an exemplary embodiment.

Referring generally to the figures, systems and methods using graphene mounted on aerogel and components thereof are shown according to exemplary embodiments. Graphene is a one-atom-thick layer of carbon atoms packed in a honeycomb lattice. Graphene has several advantageous electronic properties including high electron mobility, high thermal conductivity, small nuclear magnetic moments, and high permittivity. Graphene further has an advantageous density state, advantageous electronic, optical, and plasmonic band structures, and other advantageous electronic, optical, and quantum-mechanical properties. These properties are particularly present in monolayer (one-atom-thick) sheets or films of graphene, which substantially behave as a single crystalline material. Sheets of substantially randomly arranged graphene nanostructures have discontinuities and portions arranged in non-planar fashions, and thus behave like polycrystalline or amorphous materials, causing scattering of phonons and diminishing the beneficial properties of the graphene sheet.

Supporting a graphene sheet on a conventional substrate, such as a silicon substrate, diminishes the beneficial properties of graphene because the graphene sheet phononically couples to the substrate. The conventional method of combating the phononic coupling is to suspend the graphene in free space over a trench in the substrate. However, this method results in the graphene being inherently unsupported. Moreover, the trenched and non-trenched regions create non-uniform properties in the graphene and limit the applications of graphene. For example, it may be preferred to mechanically support a macroscopic sheet of graphene.

One way to limit the loss of mobility and other advantageous properties of graphene is to mount the graphene sheet on a porous substrate rather than a full density one. One porous material that may be used is aerogel (e.g., aerojelly, frozen smoke, solid air, etc.). Aerogel is formed from a gel in which the liquid component has been replaced with a gas. The sol-gel process or super-critical drying may be used to make aerogel. The aerogel may be made from silica, carbon, carbon oxides, alumina, chromia, etc. Carbon aerogels can include carbon nanotube or graphene aerogels.

Using aerogel as a substrate for the graphene sheet provides a mechanical support for the graphene sheet while decreasing the coupling constant between the graphene sheet and the substrate. Decreasing the coupling constant reduces phononic coupling effects and minimizes substrate-induced effects on the electronic, optical, and quantum-mechanical properties of the graphene film.

Before discussing further details of the graphene-aerogel systems and methods and the components and uses thereof, it should be noted that for purposes of this disclosure, the term coupled means the joining of two members directly or indirectly to one another. Such joining may be stationary in nature or moveable in nature and such joining may allow for the flow of fluids, electricity, electrical signals, or other types of signals or communication between the two members. Such joining may be achieved with the two members or the two members and any additional intermediate members being integrally formed as a single unitary body with one another or with the two members or the two members and any additional intermediate members being attached to one another. Such joining may be permanent in nature or alternatively may be removable or releasable in nature.

Figure 2:
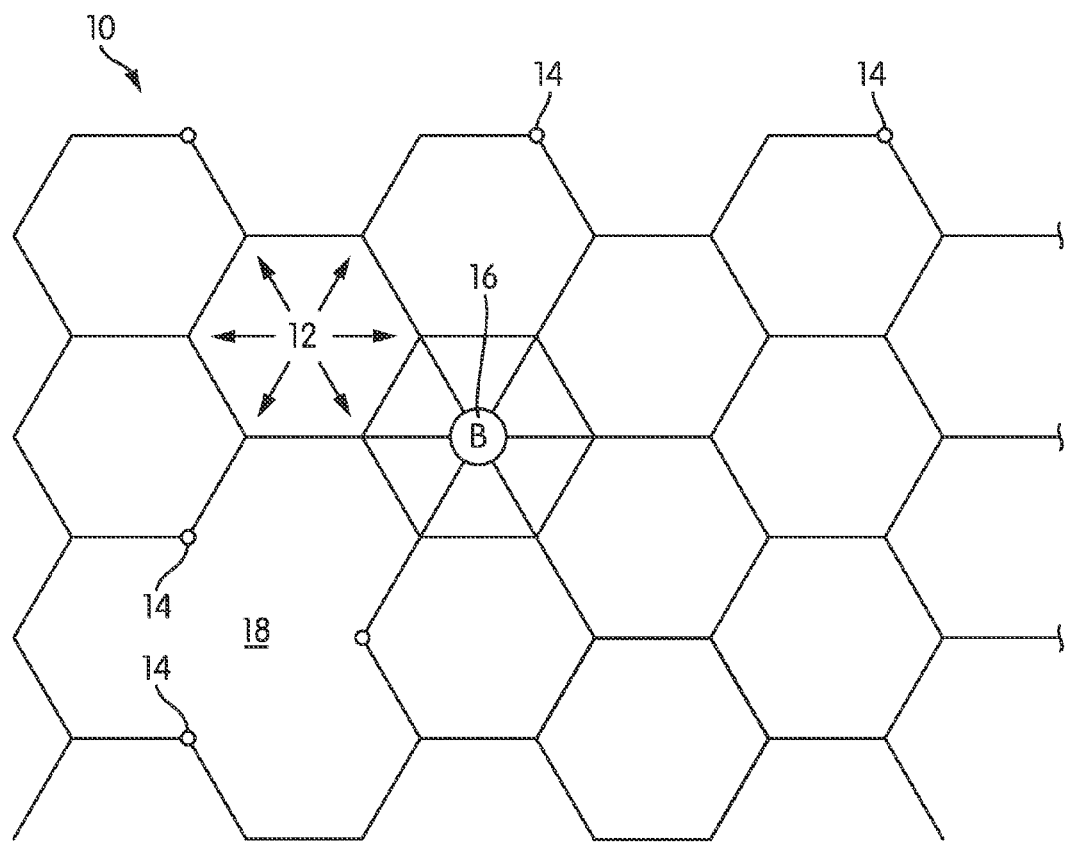
FIG. 2 is a schematic plan view of a portion of a graphene sheet, shown according to another embodiment.

Referring to FIGS. 1-2, schematic plan views of a portion of a graphene sheet 10 are shown according to exemplary embodiments. Graphene forms a hexagonal or honeycomb lattice of carbon atoms 12. A monolayer graphene sheet or film comprises a substantially two-dimensional, one-atom-thick plane. For the purposes of this application, the carbon lattice of the graphene sheet is referred to as being a plane even though in practice, the sheet may have waves or ripples passing therethrough, or may exhibit curvature on a macro scale. One of skill in the art will understand that the graphene sheet has planar properties even though it may not meet a strict geometric definition of a plane.

Graphene sheets may be formed in a variety of ways including, but not limited to, drawing, epitaxial growth, vapor deposition, etc. The graphene sheet may be pure (e.g., an all-carbon honeycomb lattice) or doped. Doping may occur in a variety of ways. Referring to FIG. 2, a graphene sheet may be doped with non-carbon atoms. For example, nitrogen atoms 14, boron atoms 16, phosphorus atoms, and/or sulfur atoms may be inserted or formed into the carbon lattice. As shown, doping may create one or more holes 18 or other defects in the lattice. Another method of doping the graphene sheet (not shown) is to modify (e.g., cut, etc.) a lateral edge of the graphene sheet to create a non-uniform (e.g., ragged, substantially non-linear, etc.) boundary shape.

Figure 3:
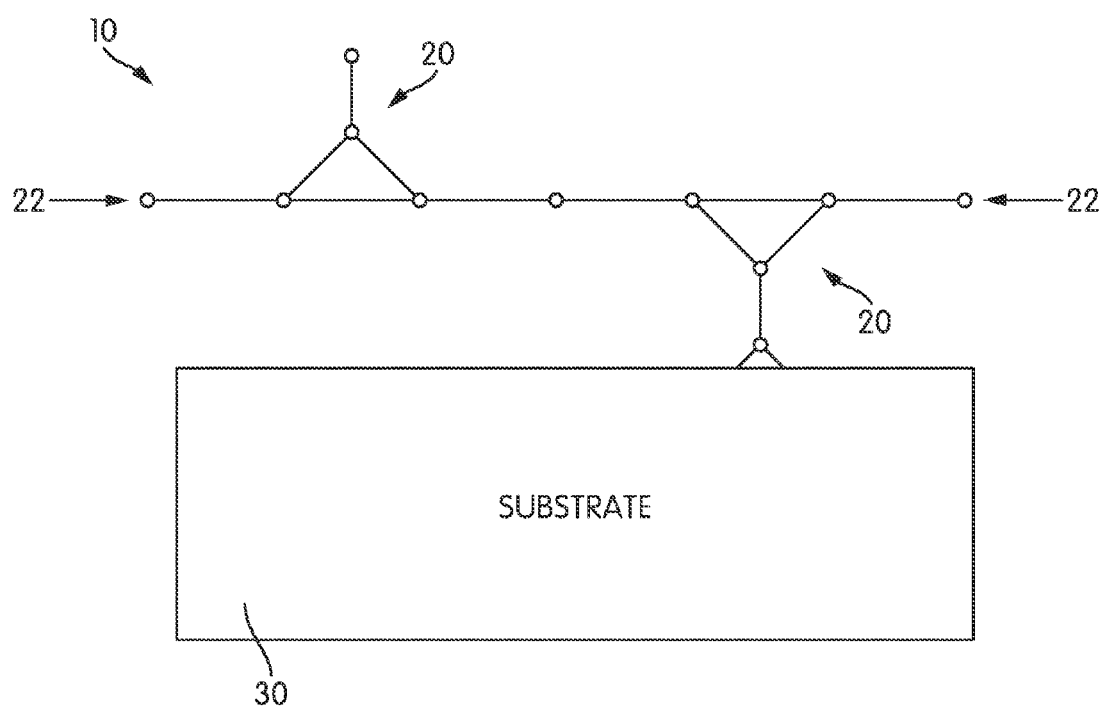
FIG. 3 is a schematic elevational view of a graphene sheet and a substrate, shown according to an exemplary embodiment.

Referring to FIG. 3, a schematic elevation view of the graphene sheet 10 and a substrate 30 is shown, according to an exemplary embodiment. The graphene sheet 10 may be doped with one or more functional groups 20 that extend out of the graphene plane 22. The functional group may be selected from any suitable functional group, including, but not limited to, oxygen (i.e., graphene oxide), hydrogen (e.g., graphane), fluorine, methyl, ethyl, ester, phenol, hydrocarbyl, haloalkane, polypeptides, etc. The hydrogen or graphane functional groups cause the graphene sheet 10 to act as an insulator. The graphene sheet 10 may be functionalized at one or more sites. According to one embodiment, the graphene sheet 10 may be functionalized at all sites. The graphene sheet 10 may be functionalized only on the side adjacent the substrate 30, only on the side opposite the substrate 30, or any combination thereof. As shown, the graphene sheet 10 may bond to the substrate 30 via one or more functional groups 20.

Figure 4A:
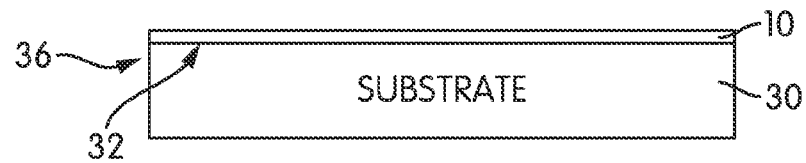
FIGS. 4A-4E are schematic elevational views of aerogel substrates and graphene sheets, shown according to various embodiments.
Figure 4B:
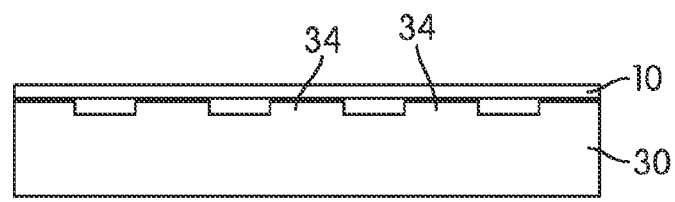

Referring to FIGS. 4A-4D, schematic elevation views of aerogel substrates 30 and graphene sheets 10 are shown, according to exemplary embodiments. FIG. 4A shows an aerogel substrate 30 having a substantially homogeneous surface 32, which supports the graphene sheet 10. The substrate 30 is further shown to have uniform properties in depth. As shown, the graphene sheet 10 is in planar contact with the surface 32 of the aerogel substrate 30. The graphene sheet 10 may couple to the aerogel substrate 30 at some or all of the carbon sites. According to one embodiment, the graphene sheet 10 does not couple to at least some of the sites. Reducing the number of coupling sites between the graphene sheet 10 and the substrate 30 generally reduces the phononic coupling between the graphene sheet 10 and the aerogel substrate 30. At these uncoupled sites, the graphene sheet 10 may ripple. FIG. 4B shows the aerogel substrate 30 having a structured surface. One or more structures 34 may extend laterally and may be coordinated with graphene sites where minimal perturbation of in-plane properties is important. For example, the structures 34 may be configured to support the graphene sheet 10 at nodes or antinodes. According to various embodiments, the structures 34 may be posts formed of aerogel or nanotubes. The nanotubes may be formed of carbon (e.g., if a carbon based aerogel) or silicon (e.g., if a silica based aerogel).

Figure 4C:
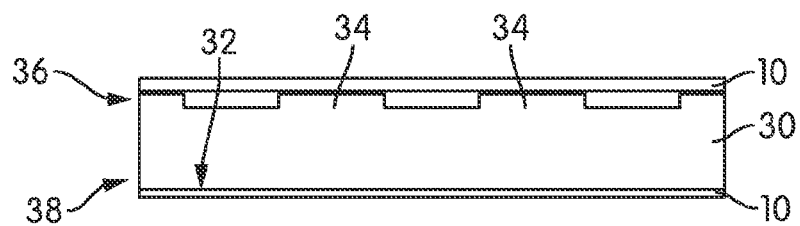
Figure 4D:
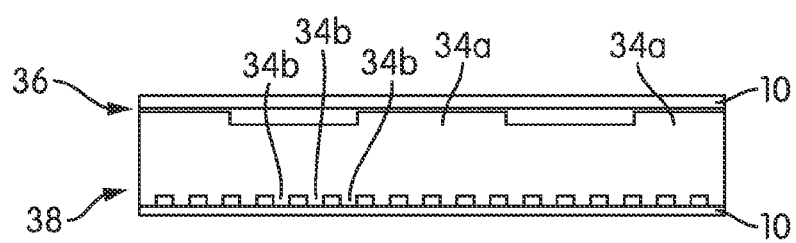

According to the embodiment shown in FIG. 4C, the aerogel substrate 30 may be two sided. A first side 36 is shown to have a structured surface 34, and a second side 38 is shown to have a substantially homogenous surface 32. FIG. 4D shows a two-sided aerogel substrate 30 having a structured surface 34 on each side. The first side 36 is shown to include a first structured surface 34a, and the second side 38 is shown to include a second structure surface 34b. Having different structures on each side of the substrate may result in different properties on each side of the substrate 30.

Figure 4E:
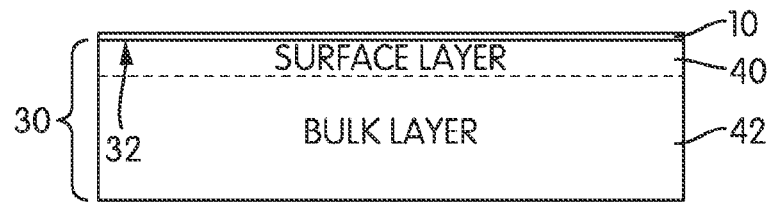

According to the embodiment shown in FIG. 4E, the aerogel substrate 30 properties may vary with depth. As shown, the substrate 30 includes a surface layer 40 near the graphene supporting surface (e.g., structured surface 34 homogeneous surface 32, as shown) and a bulk layer 42. The transition between the surface layer 40 and the bulk layer 42 may be gradual or distinct, and the substrate 30 may include any number of intermediary layers. According to one embodiment, the surface layer 40 may be configured to have a different density than the bulk layer 42. According to another embodiment, referring generally to FIG. 3, the surface layer 40 may be configured to chemically bond to functional groups 20 extending from the graphene sheet 10.

Figure 5A:
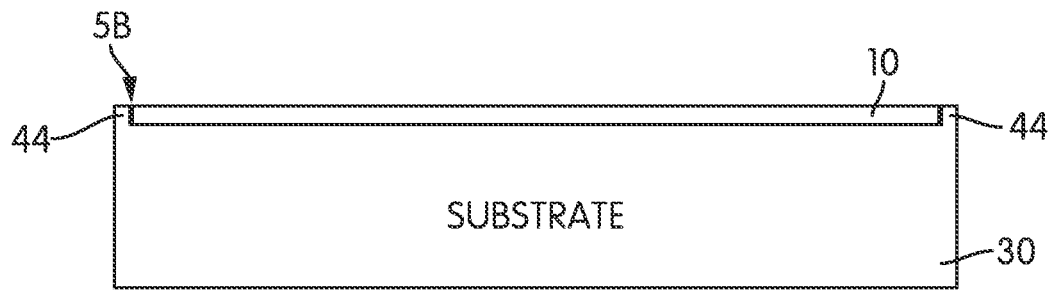
FIG. 5A is a schematic cross-sectional elevational view of a substrate and a graphene sheet, shown according to an exemplary embodiment.
Figure 5B:
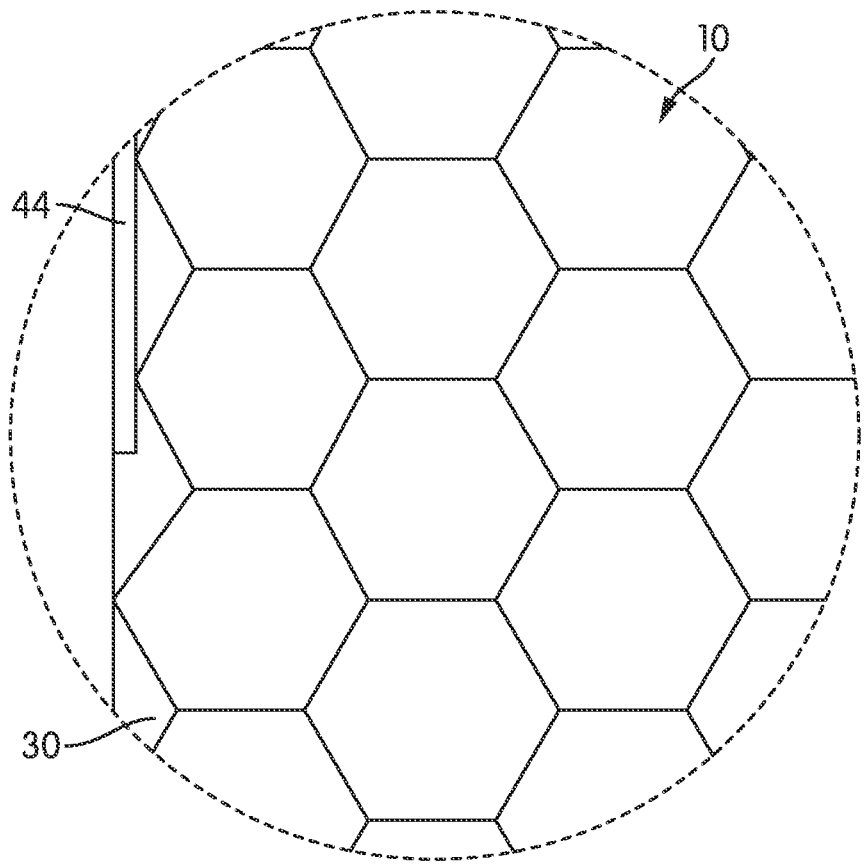
FIG. 5B is a schematic plan view of a substrate and a graphene sheet, shown according to an exemplary embodiment.

Referring to FIGS. 5A-5B, schematic diagrams of an aerogel substrate 30 and a graphene sheet 10 are shown, according to an exemplary embodiment. The substrate 30 is shown to include lateral support structures 44 disposed at a lateral edge of the graphene sheet 10. The lateral support structures 44 may be configured to laterally support the graphene sheet 10. The structures 44 may be coordinated with graphene sites where minimal perturbation of in-plane properties is important. For example, structures 44 may be configured to support the graphene sheet 10 at nodes or antinodes. For example, as shown in the enlarged top plan view of FIG. 5B, the lateral support structures 44 may be coordinated with selected sites. The embodiment of FIGS. 5A and 5B shows the lateral support structures 44 to be formed of the aerogel substrate. According to other embodiments, the lateral support structures may be another component and formed of another material. For example, the lateral support structures may extend from supports configured to restrain the substrate 30.

Referring to FIGS. 4A and 6A-6C, schematic block diagrams of aerogel substrates 30 and graphene sheets 10 are shown, according to exemplary embodiments. As shown in FIG. 4A, the substrate 30 includes a first side 36 configured to support the graphene sheet 10. According to an exemplary embodiment, the graphene sheet 10 is a monolayer film coupled to the aerogel substrate 30. According to the embodiment shown in FIG. 6A, a substrate 30 is disposed on each side of the graphene sheet 10. As shown, a first substrate 30a supports a first side 24 of the graphene sheet 10, and a second side 26 of the graphene sheet 10 supports a second substrate 30b. One or more additional graphene sheets 10 may be stacked on the free side of one of the substrates 30.

Figure 6A:
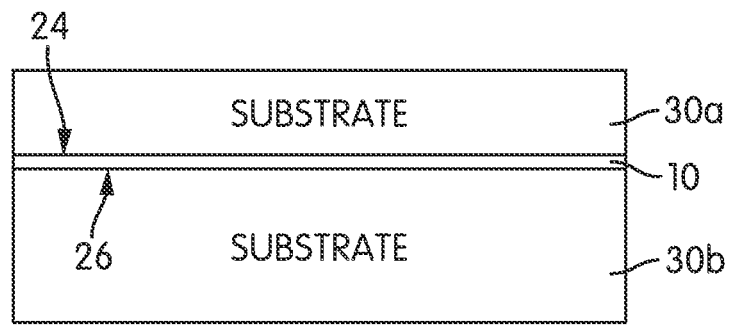
FIGS. 6A-6C are schematic elevational views of aerogel substrates and graphene, shown according to various embodiments.
Figure 6B:
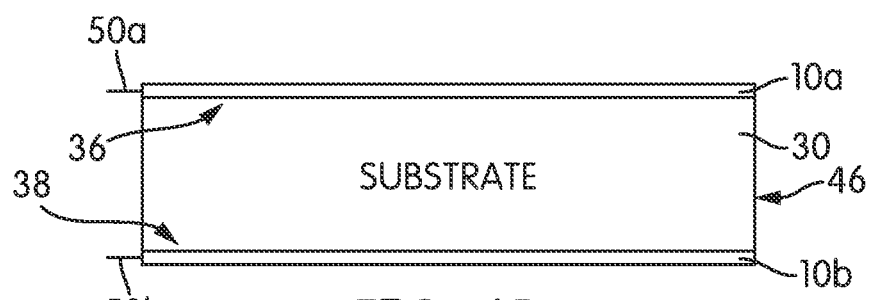

According to the embodiment shown in FIG. 6B, the substrate 30 includes a first side 36 configured to support a first graphene sheet 10a and a second side 38 opposite the first side 36 configured to support a second graphene sheet 10b. One or both of the first and second graphene sheets 10a, 10b may be a monolayer of graphene. According to one embodiment, the second side could be a lateral side 46 of the substrate 30. According to other embodiments a second substrate 30 may be stacked on the free side of one of the graphene sheets 10a, 10b.

The graphene-substrate-graphene configuration of FIG. 6B may be configured as a capacitor, e.g., to form a static electric field between the graphene sheets 10 and across the substrate 30. The first graphene sheet 10a may be configured to receive a first electrical charge. For example, the first graphene sheet 10a may be coupled to a first electrical contact 50a. Similarly, the second graphene sheet 10b may be configured to receive a second electrical charge. For example, the second graphene sheet 10b may be coupled to a second electrical contact 50b. A voltage may be applied across the first and second electrical contacts 50a, 50b. Accordingly, positive or negative charges will build up on the first and second graphene sheets 10a, 10b depending on the polarity of the voltage applied.

Figure 6C:
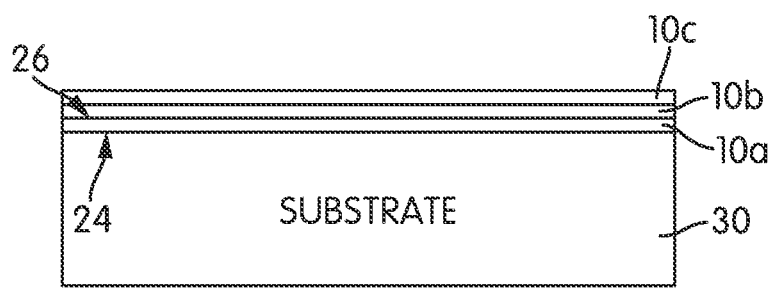

According to the embodiment shown in FIG. 6C, a first side 24 of the graphene sheet 10a is supported by the substrate 30. A second graphene sheet 10b is disposed on the second side 26 of the first graphene sheet 10a. As shown, a first side of the second graphene sheet is disposed adjacent to the second side 26 of the first graphene sheet, opposite the substrate 30. A third graphene 10c sheet may be disposed on or adjacent a second side of the second graphene sheet 10b, opposite the first graphene sheet 10a and the substrate 30. Another graphene sheet 10 or another substrate 30 may be disposed on the free side of the third graphene sheet 10c. According to various embodiments, graphene sheets may be in intimate contact with each other, thereby acting as a bi-layer or tri-layer graphene sheet.

According to various embodiments, the layering of graphene sheets 10 and substrates 30 may be continued in a variety of combinations. For example, the substrate-graphene-substrate combination of FIG. 6A may be disposed on the graphene-aerogel-graphene combination of FIG. 6B to form one stack. It should also be noted that a substrate 30 may be coupled to another substrate 30. For example, substrates 30 having different properties may be coupled together to provide different properties on opposite sides of the combined substrate 30.

In any of the configurations described above, a graphene sheet 10 may be chemically bonded, unbonded, mechanically coupled, or any combination thereof to a substrate 30 or to another graphene sheet 10. The type of interaction between layers (e.g., bonded, unbonded, or mechanically coupled) may be the same or different between different layers of the stack. For example, in FIG. 6B, the top graphene sheet 10a may be unbonded to the substrate 30, whereas the bottom graphene sheet 10b may be bonded to the substrate. It is further contemplated that additional graphene sheets 10 may or may not be monolayers of graphene, and the additional substrates 30 may or may not be formed of aerogel. The graphene sheets 10 and substrates 30 may be co-formed, or may be formed separately and subsequently joined. According to one embodiment, a first graphene sheet is co-formed on a first aerogel substrate, and a second graphene sheet is co-formed on a second aerogel substrate. The first aerogel substrate is then mounted on the second graphene sheet to form a stack.

The properties of the graphene sheet 10 may change with tension or compression. For example, the normal mode of the graphene sheet 10 may be raised as one or more tensile forces are applied, which may cause changes to the electronic, optical, thermal, and quantum properties of the sheet 10. It is contemplated that tensile or compressive forces may be applied to the graphene sheet 10 in one or more ways. According to one embodiment, the graphene sheet 10 may be heated prior to being disposed on the aerogel substrate 30. Accordingly, as the graphene sheet 10 cools, the substrate 30 may hold the sheet 10 in tension. According to another embodiment, the graphene sheet 10 may be formed at a first temperature and configured to operate at a second temperature (e.g., operating temperature, upper limit of an operating temperature range, mean operating temperature, etc.) which is lower than the first temperature. The graphene sheet 10 may then be disposed on the substrate 30 while above the second temperature. Accordingly, as the graphene sheet 10 cools, the substrate 30 may hold the sheet 10 in tension, and some tension will be maintained up to the operating temperature of the graphene sheet 10. According to another embodiment, the substrate 30 may be chilled prior to the application of the graphene sheet 10. Accordingly, the substrate 30 will apply tension to the graphene sheet 10 as the substrate 30 expands as it returns to a nominal temperature. According to another embodiment the aerogel substrate 30 may be heated before the graphene sheet 10 is disposed thereon. Accordingly, as the aerogel substrate 30 cools, a compressive force is applied to the graphene sheet 10. According to another embodiment, the graphene sheet 10 may be cooled prior to be disposed on the aerogel substrate 30; the aerogel substrate 30 thus applying compressive forces to the graphene sheet 10 as the graphene sheet 10 warms to the temperature of the aerogel substrate 30. According to yet another embodiment, the graphene sheet 10 may be formed at a first temperature and configured to operate at a second temperature (e.g., operating temperature, upper limit of an operating temperature range, mean operating temperature, etc.) which is higher than the first temperature. The graphene sheet 10 may then be disposed on the substrate 30 while below the second temperature. Accordingly, as the graphene sheet 10 warms, the substrate 30 compress the sheet 10, and some compression will be maintained up to the operating temperature of the graphene sheet 10.

Figure 7A:
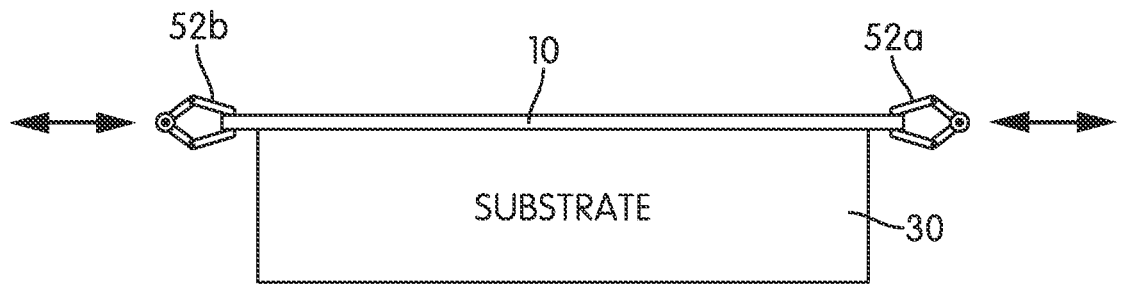
FIG. 7A is a schematic elevational view of a substrate and a graphene sheet, shown according to another embodiment.
Figure 7B:
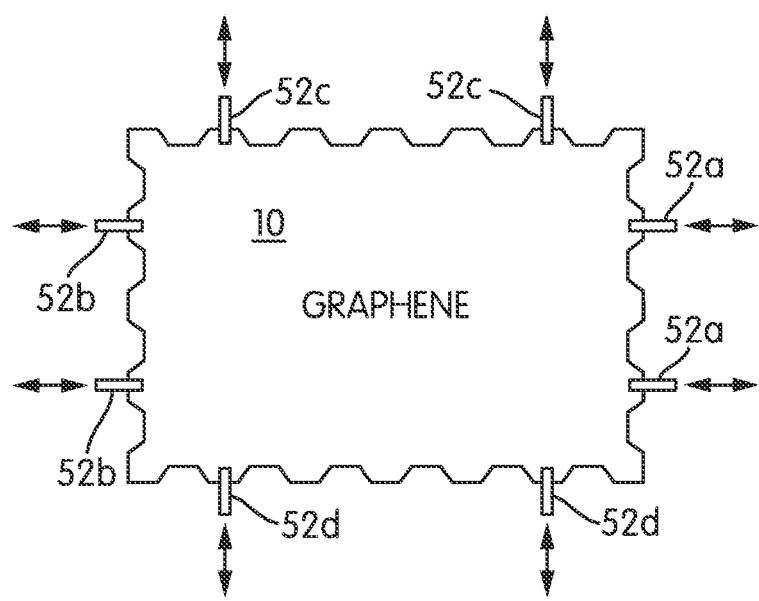
FIG. 7B is a schematic plan view of a substrate and a graphene sheet, shown according to another embodiment.

Referring generally to FIGS. 7A-7B, the graphene sheet 10 may be mechanically stretched. According to one embodiment, the graphene sheet 10 may be mechanically stretched prior to being mounted on the substrate 30, and the substrate 30 then holding the graphene sheet 10 in tension. For example, the one or more support structures 34, or lateral support structures 44, may be configured to maintain tension on the graphene sheet 10. The graphene sheet 10 may be stretched in one or more directions prior to mounting in order to achieve desired properties.

According to the embodiment schematically shown in FIGS. 7A-7B, one or more tensioners 52 (e.g., mechanical coupling, clamp, structure, etc.) may be configured to provide a tensile force to the graphene sheet 10. FIG. 7A shows two opposed tensioners 52a, 52b which may be drawn in opposite directions, for example, by a servo-motor, variable magnetic field, magnetostriction, piezoelectric actuators, etc. FIG. 7B shows a plurality of tensioners 52 configured to apply tensile forces in more than one direction. For example, first tensioners 52a, 52b are configured to pull the graphene sheet 10 in a first direction, and second tensioners 52c, 52d are configured to pull the graphene sheet 10 in a second direction. Tensioners 52 may be configured to pull the graphene sheet in any number of directions. For example, three pairs of tensioners may be oriented and configured to pull the graphene sheet 10 in the directions of the graphene lattice.

According to one embodiment, the tensioners 52 may be configured such that they may provide a selectable tensile force to the graphene sheet 10. Providing a selectable tensile force to the graphene sheet 10 enables tuning of the graphene sheet 10 to achieve desired properties. For example, applying tensile forces in certain directions may make certain properties of the graphene sheet 10 directionally dependent.

According to one embodiment, the graphene sheet 10 may be fixed at one end, for example, coupled to the substrate 30 or other fixed structure, and pulled by an opposing tensioner 52. According to another embodiment, the graphene sheet 10 may be pre-stretched, as described above, and coupled to the tensioners 52 in a stretched state. Accordingly, the tensioners 52 would maintain the tension on the graphene sheet 10.

Referring to FIGS. 8-9, the graphene sheet 10 may be configured to support one or more devices 56, shown as a first through third devices 56a, 56b, and 56c. According to various embodiments, the one or more devices 56 may include a photonic circuit, a plasmonic circuit, an electronic circuit, an integrated circuit, a microelectromechanical system, a nano-electro-mechanical system, etc., or a combination thereof. The devices 56 may be formed by doping, functionalizing, etching, cutting, shaping, or applying electrical fields to the graphene sheet 10. The devices 56 may be configured to take advantage of the electronic properties (e.g., electron mobility, electron transport, band structures, density of states, etc.) of the graphene sheet 10. Using aerogel as a substrate 30 for the graphene sheet 10 mechanically supports the graphene sheet 10 while reducing phononic coupling between the graphene and the substrate 30, thus reducing substrate-induced effects in the graphene and preserving the electron properties in the graphene sheet 10. As described above, these device-including graphene sheets 10 maybe coupled or mounted to one or more sides of a substrate 30.

Figure 8A:
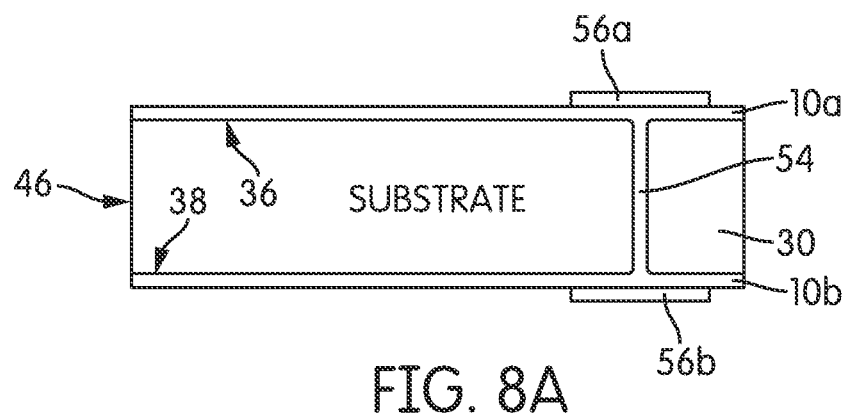
FIGS. 8A-8B are schematic cross-sectional elevational views of a substrate and a graphene sheet, shown according to various embodiments.
Figure 8B:
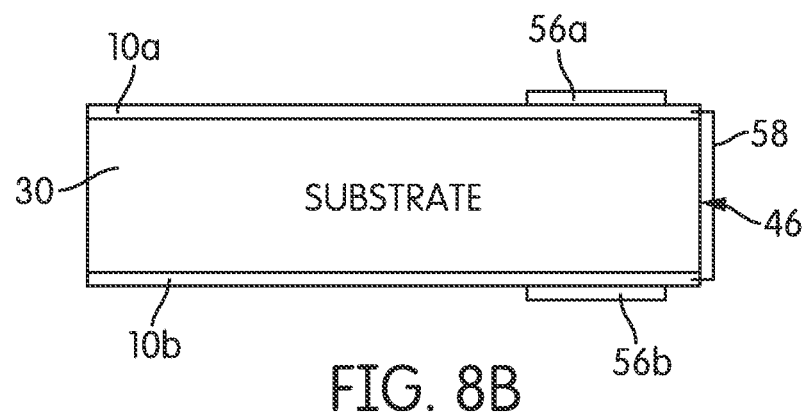

As shown in FIGS. 8A-8B, a first graphene sheet 10a including a first device 56a is disposed on a first side of the substrate 30, and a second graphene sheet 10b including a second device 56b is disposed on a second side of the substrate 30. It is contemplated that graphene sheets 10 may be disposed one or more lateral sides 46 of the substrate 30. The first and second sheets 10a, 10b of graphene may be operatively coupled. According to various embodiments, the graphene sheets 10 may be electronically, phononically, plasmonically, photonically, and/or quantumly coupled. According to the embodiment shown in FIG. 8A, the substrate 30 includes an opening 54 (e.g., through-hole, via, aperture, etc.) extending from the first side 36 of the substrate 30 to the second side 38 of the substrate. The first and second graphene sheets 10a, 10b may be coupled through the opening 54. For example, the opening 54 may be lined with a conductive material, a nanotube may extend through the opening 54, or a connecting structure may pass through the opening 54. According to the embodiment shown in FIG. 8B, the connecting structure 58 may pass around a lateral end 46 of the substrate 30. According to various embodiments, the connecting structure 58 may be a bracket, a wire, a nanotube, a graphene sheet, or a graphene ribbon. The connecting structure 58 may be electrically conductive. As described above, additional graphene sheets 10 or substrates 30 may be mounted on a free side of the first or second graphene sheets 10a, 10b in order to increase the number of layers in the stack. Increasing the number of layers in the stack facilitates more efficient use of three-dimensional space, thereby enabling smaller systems.

Figure 9A:
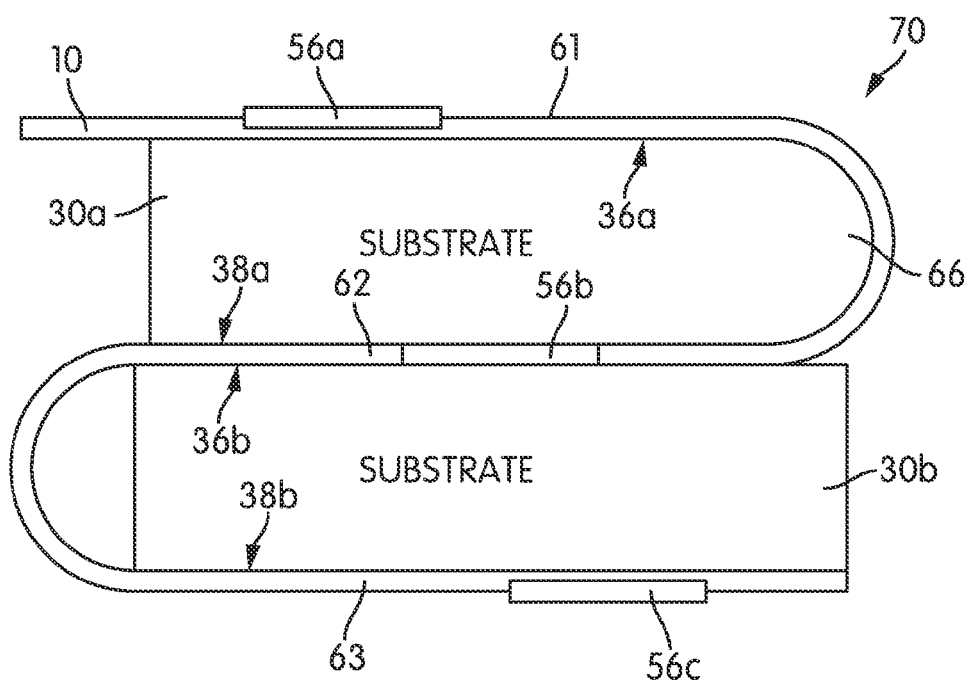
FIGS. 9A-9B are schematic elevational views of a substrate and a graphene sheet, shown according to various embodiments.
Figure 9B:
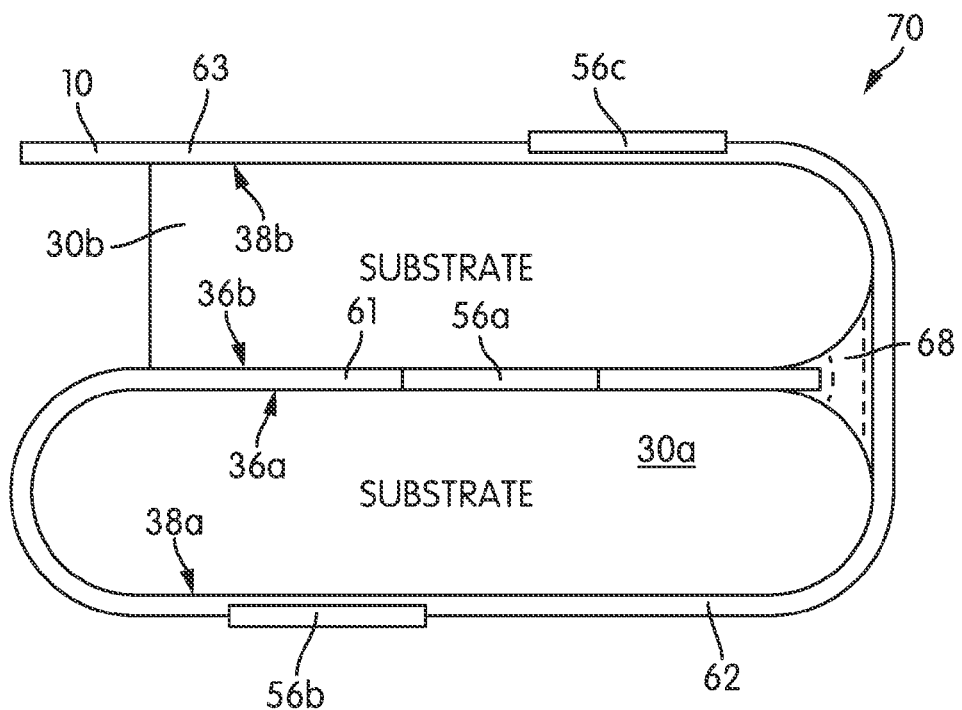
Figure 9C:
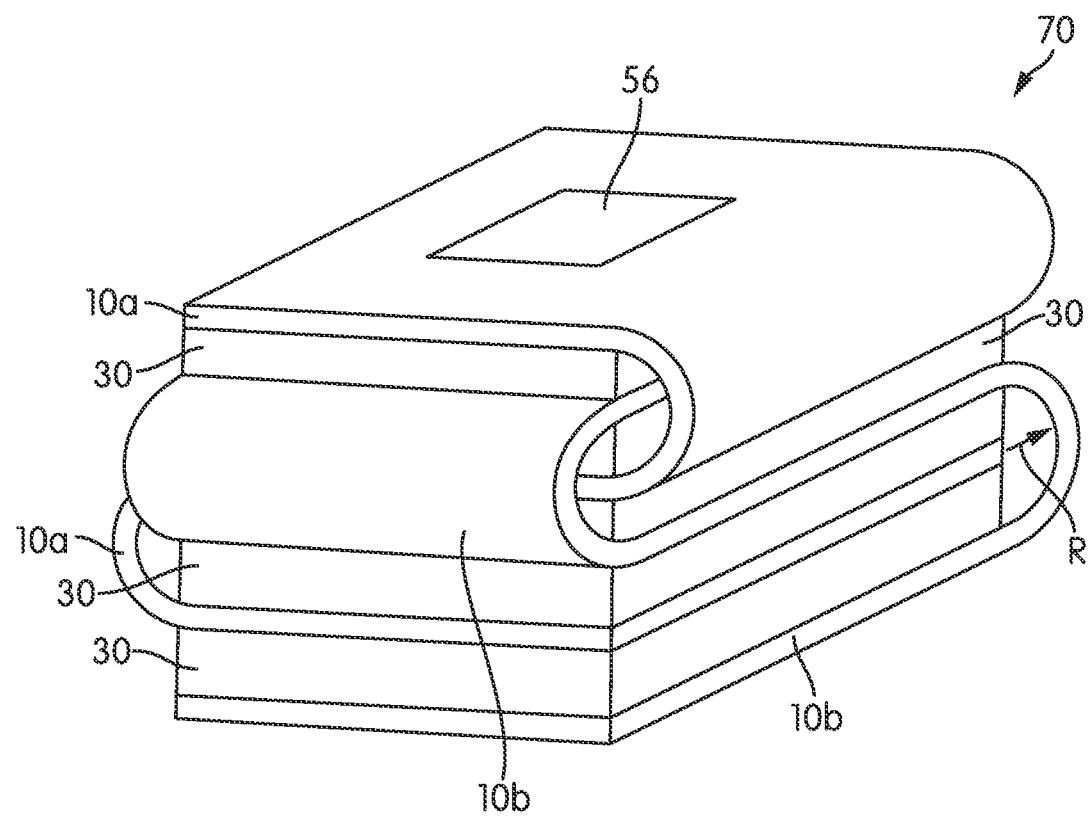
FIG. 9C is a schematic perspective views of interwoven substrates and graphene sheets, shown according another embodiment.

Referring to FIGS. 9A-9C, the flexible nature of graphene sheet 10 may be used to facilitate construction of a circuit board 70. As shown, the graphene sheet 10 includes a first portion 61, a second portion 62, and a third portion 63, and one or more devices 56 may be disposed on the graphene sheet 10. The first portion 61 of the graphene sheet 10 may be coupled to a first side 36a of a first substrate 30a. The graphene sheet 10 is then folded or wrapped around the substrate 30a, and the second portion 62 of the graphene sheet 10 may couple to the second side 38a of the substrate 30a. A lateral end 66 of the substrate 30 may be configured to support the graphene sheet 10 as it transits from the first side 36 of the substrate 30 to the second side 38. As shown, the lateral end 66 may be configured to support a portion of the graphene sheet 10 between the first portion 61 and the second portion 62. The lateral end 66 of the substrate 30 is contoured or rounded to reduce stresses on the graphene sheet 10 and to prevent kinking or creasing of the sheet 10. A second substrate 30b may be coupled to the free side of the second portion 62 of the graphene sheet 10, and the graphene sheet 10 may be folded around the second substrate 30b. The third portion 63 of the graphene sheet 10 may then couple to the second side 38b of the second substrate 30b.

Referring to FIG. 9B, the second substrate 30b may be disposed on the free side of the first portion 61, and the graphene sheet 10 is then folded around the first and second substrates 30a, 30b. The third portion 63 of the graphene sheet 10 may then be disposed adjacent the second side 38b of the second substrate 30b.

According to one embodiment, the first and second substrates 30a, 30b of the embodiment of FIG. 9B are formed as one aerogel substrate 30. For example, a member 68 (e.g., flange, web, structure, element, etc.) may couple the first substrate 30a and the second substrate 30b. According to such an embodiment, the first portion 61 of the graphene sheet 10 may be disposed between the first portion 30a of the substrate 30 and the second portion 30b of the substrate 30. The graphene sheet 10 may then be folded such that the second portion 62 of the graphene sheet 10 is disposed adjacent to a second side 38a of the first portion 30a of the substrate 30, and then folded again such that the third portion 63 of the graphene sheet 10 is disposed adjacent a second side 38b of the second portion 30b of the substrate 30.

Constructing a circuit board 70 in these manners enables all of the devices 56 of the circuit board 70 to be laid out on one graphene sheet 70, which may be folded for compactness. This reduces or eliminates the need for layer to layer connections (e.g., vias or edge connectors) as the graphene sheet 10 continues from one layer to another. This may reduce circuit board development time and complexity.

Referring to FIG. 9C, multiple graphene sheets 10 may be interwoven in a stack of graphene sheets 10 and substrates 30. As shown, a first graphene sheet 10a and a second graphene sheet 10b are interwoven with a plurality of substrates 30. Interweaving the graphene sheets 10 enables more efficient use of space and enables a minimum radius R to be maintained in order to avoid kinking or creasing the graphene sheet 10.

Figure 10:
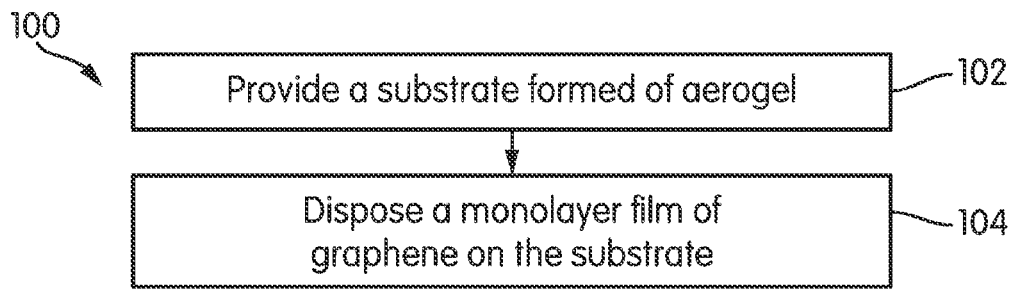
FIG. 10 is a flowchart of a process for reducing phononic coupling between a graphene monolayer and a substrate, shown according to an exemplary embodiment.

Referring to FIG. 10, a flowchart of a process 100 for reducing phononic coupling between a graphene monolayer and a substrate is shown, according to an exemplary embodiment. Process 100 is shown to include the step of providing a substrate formed of aerogel (step 102). Process 100 is further shown to include the step of disposing a monolayer film of graphene on the substrate (step 104), for example, placing a monolayer film of graphene in contact with the substrate.

Figure 11:
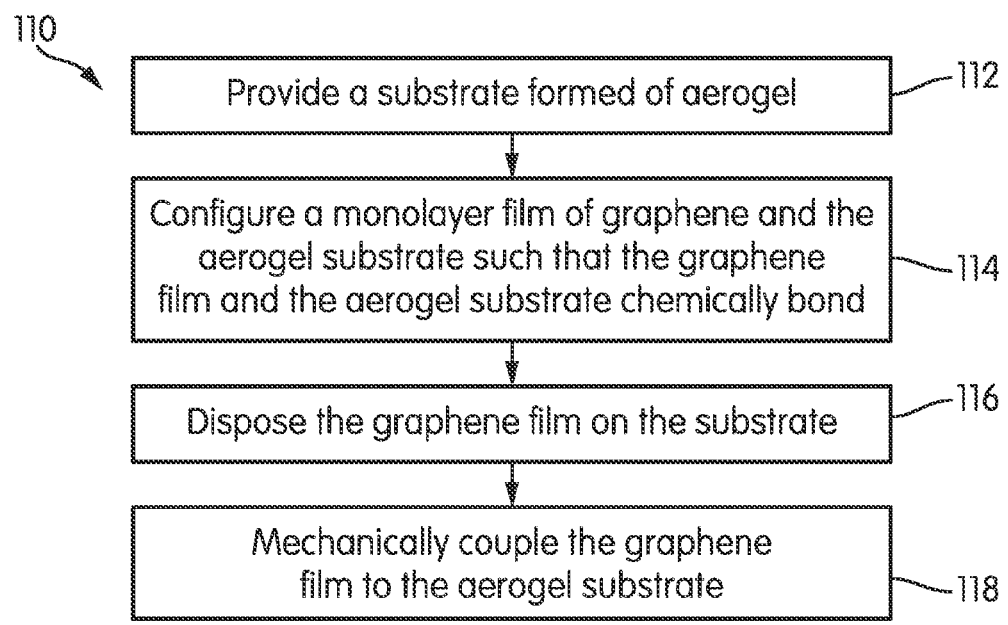
FIG. 11 is a flowchart of a process for reducing phononic coupling between a graphene monolayer and a substrate, shown according to another embodiment.

Referring to FIG. 11, a flowchart of a process 110 for reducing phononic coupling between a graphene monolayer and a substrate is shown, according to an exemplary embodiment. Process 110 is shown to include the steps of providing a substrate formed of aerogel (step 112), configuring a monolayer film of graphene and the aerogel substrate such that the graphene film and the aerogel substrate chemically bond (step 114), disposing the graphene film on the substrate (step 116), and mechanically coupling the graphene film to the aerogel substrate (step 118). According to various embodiments, the process 110 may only involve bonding the graphene to the substrate (step 114) or mechanically coupling the graphene to the substrate (step 118). In such embodiments, the step 118 or step 114, respectively, may be omitted.

Figure 12:
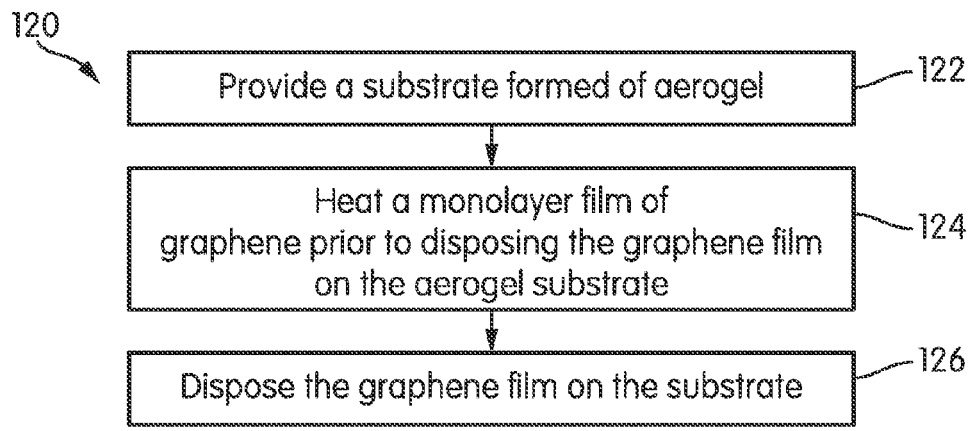
FIG. 12 is a flowchart of a process for reducing phononic coupling between a graphene monolayer and a substrate, shown according to another embodiment.

Referring to FIG. 12, a flowchart of a process 120 for reducing phononic coupling between a graphene monolayer and a substrate is shown, according to an exemplary embodiment. Process 120 is shown to include the steps of providing a substrate formed of aerogel (step 122), heating a monolayer film of graphene prior to disposing the graphene film on the aerogel substrate (step 124), and disposing the graphene film on the substrate (step 126).

Figure 13:
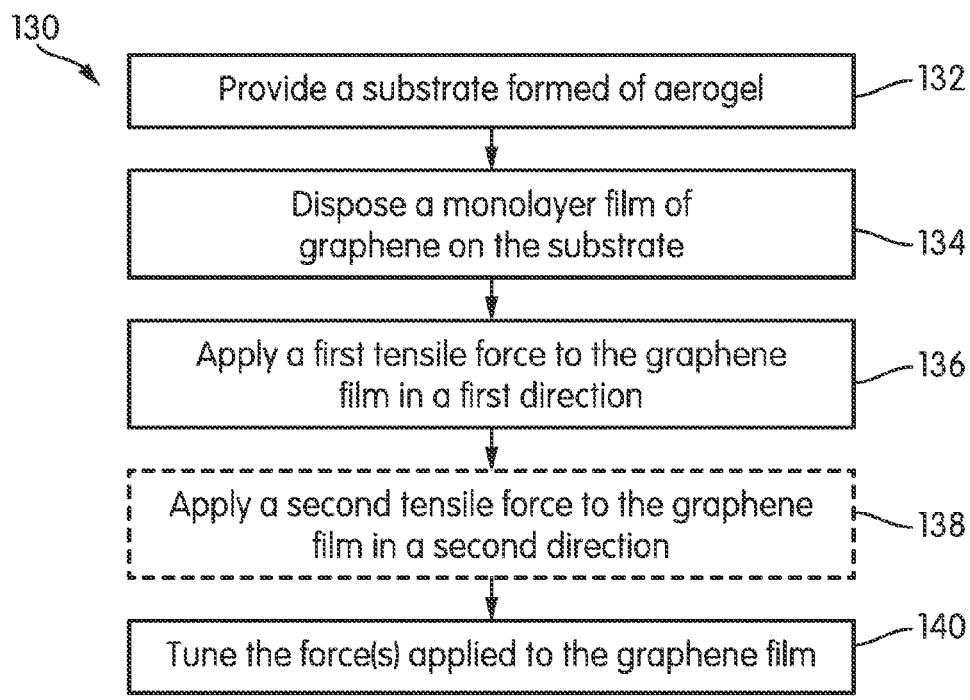
FIG. 13 is a flowchart of a process for reducing phononic coupling between a graphene monolayer and a substrate, shown according to another embodiment.

Referring to FIG. 13, a flowchart of a process 130 for reducing phononic coupling between a graphene monolayer and a substrate is shown, according to an exemplary embodiment. Process 130 is shown to include the steps of providing a substrate formed of aerogel (step 132), disposing a monolayer film of graphene on the substrate (step 134), applying a first tensile force to the graphene film in a first direction (step 136), and tuning the force(s) applied to the graphene film (step 140). Process 130 may further include the step of applying a second tensile force to the graphene film in a second direction (step 138), which may also be tuned (step 140).

Figure 14:
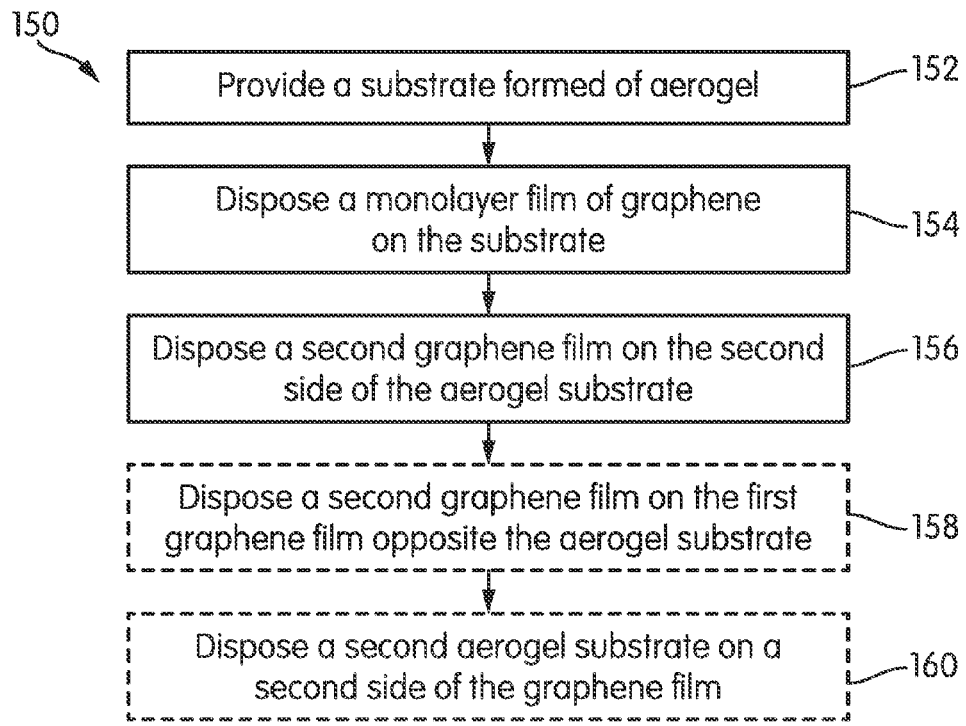
FIG. 14 is a flowchart of a process for reducing phononic coupling between a graphene monolayer and a substrate, shown according to another embodiment.

Referring to FIG. 14, a flowchart of a process 150 for reducing phononic coupling between a graphene monolayer and a substrate is shown, according to an exemplary embodiment. Process 150 is shown to include the steps of providing a substrate formed of aerogel (step 152), disposing a monolayer film of graphene on the substrate (step 154), and disposing a second graphene film on the second side of the aerogel substrate (step 156). Process 150 may further include the step of disposing a second graphene film on the first graphene film opposite the aerogel substrate (step 158) or disposing a second aerogel substrate on a second side of the graphene film (step 160).

Figure 15:
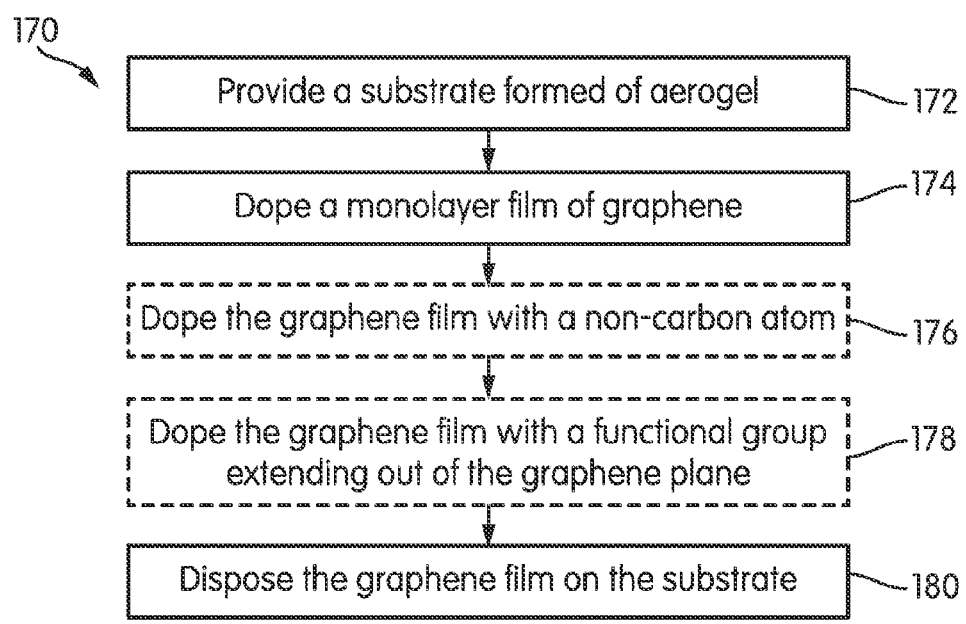
FIG. 15 is a flowchart of a process for reducing phononic coupling between a graphene monolayer and a substrate, shown according to another embodiment.

Referring to FIG. 15, a flowchart of a process 170 for reducing phononic coupling between a graphene monolayer and a substrate is shown, according to an exemplary embodiment. Process 170 is shown to include the steps of providing a substrate formed of aerogel (step 172), doping a monolayer film of graphene (step 174), and disposing the graphene film on the substrate (step 180). Process 170 may also include the steps of doping the graphene film with a non-carbon atom (step 176) and/or doping the graphene film with a functional group extending out of the graphene plane (step 178).

Figure 16:
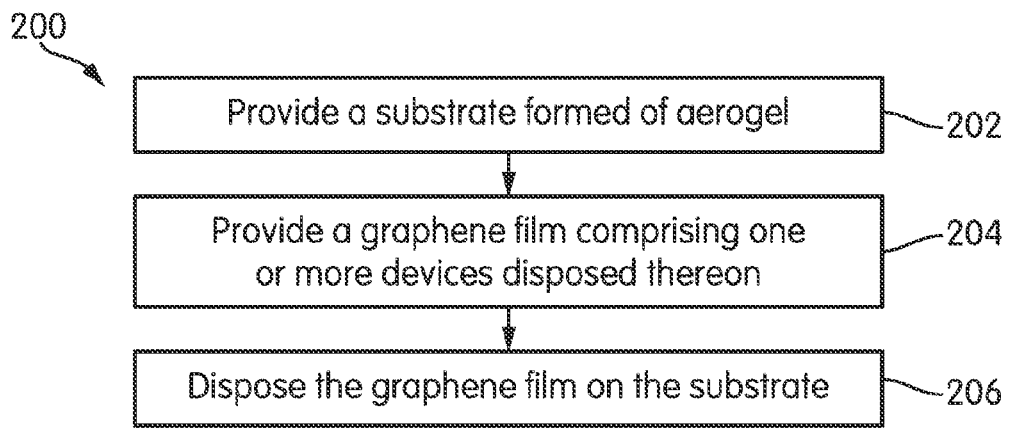
FIG. 16 is a flowchart of a process for preserving electronic properties in a mechanically supported graphene sheet, shown according to an exemplary embodiment.

Referring to FIG. 16, a flowchart of a process 200 for preserving electronic properties in a mechanically supported graphene sheet is shown, according to an exemplary embodiment. Process 200 is shown to include the steps of providing a substrate formed of aerogel (step 202), providing a graphene film having one or more devices disposed thereon (step 204), and disposing the graphene film on the substrate (step 206). According to various embodiments, the device comprises a photonic circuit, a plasmonic circuit, an electronic circuit, an integrated circuit, a micro- or nano-electromechanical device.

Figure 17:
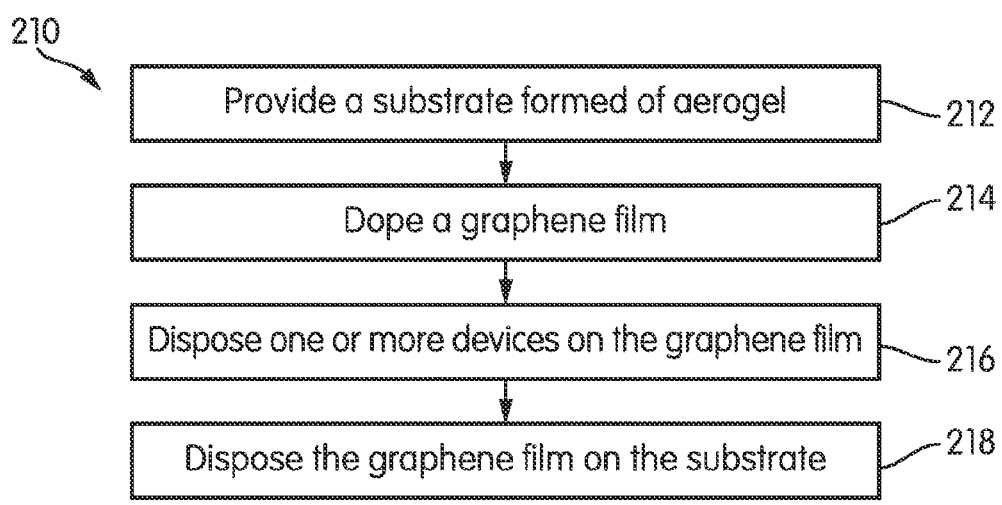
FIG. 17 is a flowchart of a process for preserving electronic properties in a mechanically supported graphene sheet, shown according to another embodiment.

Referring to FIG. 17, a flowchart of a process 210 for preserving electronic properties in a mechanically supported graphene sheet is shown, according to an exemplary embodiment. Process 210 is shown to include the steps of providing a substrate formed of aerogel (step 212), doping a graphene film (step 214), disposing one or more devices on the graphene film (step 216), and disposing the graphene film on the substrate (step 218). According to various embodiments, the doping may comprises adding one or more defects to the graphene lattice, adding one or more non-carbon atoms or molecules, or adding one or more out-of-plane functional groups. It is also contemplated that the graphene film may be doped (step 214) after the device is mounted on the graphene film (step 216) or at substantially the same time, for example, the graphene film may be formed or grown to include the device and the doping elements.

Figure 18:
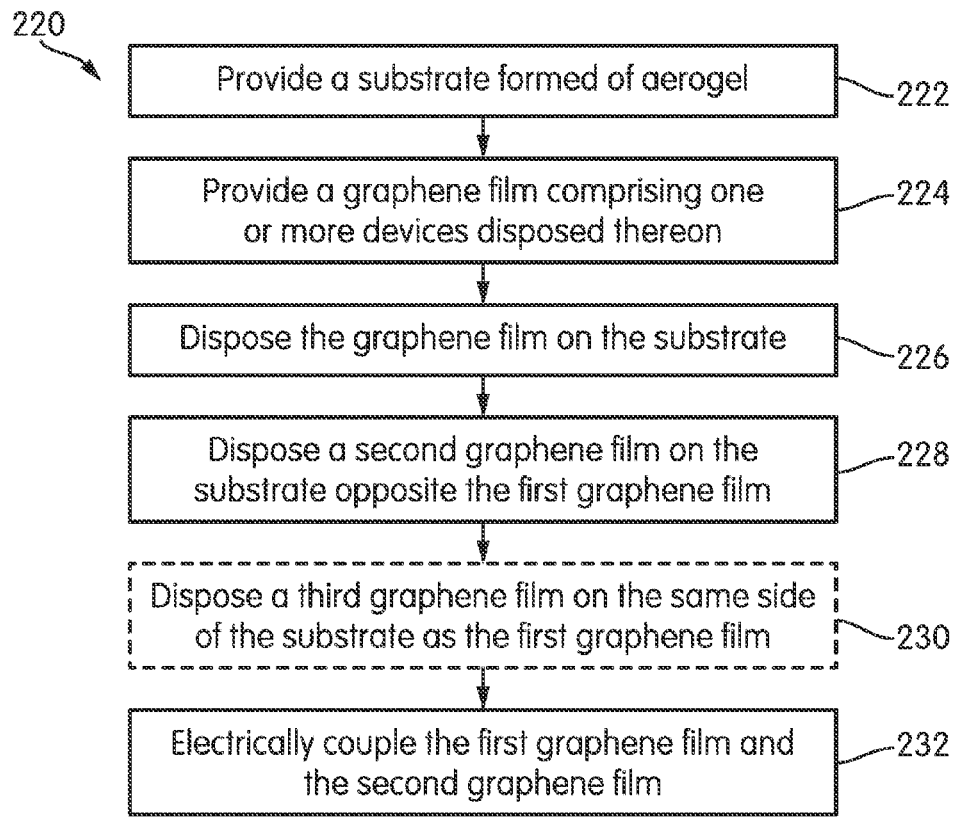
FIG. 18 is a flowchart of a process for preserving electronic properties in a mechanically supported graphene sheet, shown according to another embodiment.

Referring to FIG. 18, a flowchart of a process 220 for preserving electronic properties in a mechanically supported graphene sheet is shown, according to an exemplary embodiment. Process 220 is shown to include the steps of providing a substrate formed of aerogel (step 222), providing a first graphene film comprising one or more devices disposed thereon (step 224), disposing the first graphene film on the substrate (step 226), disposing a second graphene film on the substrate opposite the first graphene film (step 228), and electrically coupling the first graphene film and the second graphene film (step 232). Process 220 may also include the step of disposing a third graphene film on the same side of the substrate as the first graphene film (step 230). According to various embodiments, the third graphene film may be disposed on the substrate (step 230) before the second graphene film is disposed on the substrate (step 228), after the first and second graphene films are coupled (step 232), or at any time in between. According to other embodiments, the third graphene film may be disposed on a lateral side of the substrate, or on a side of the substrate opposite the first graphene film, for example, the same side as the second graphene film.

Figure 19:
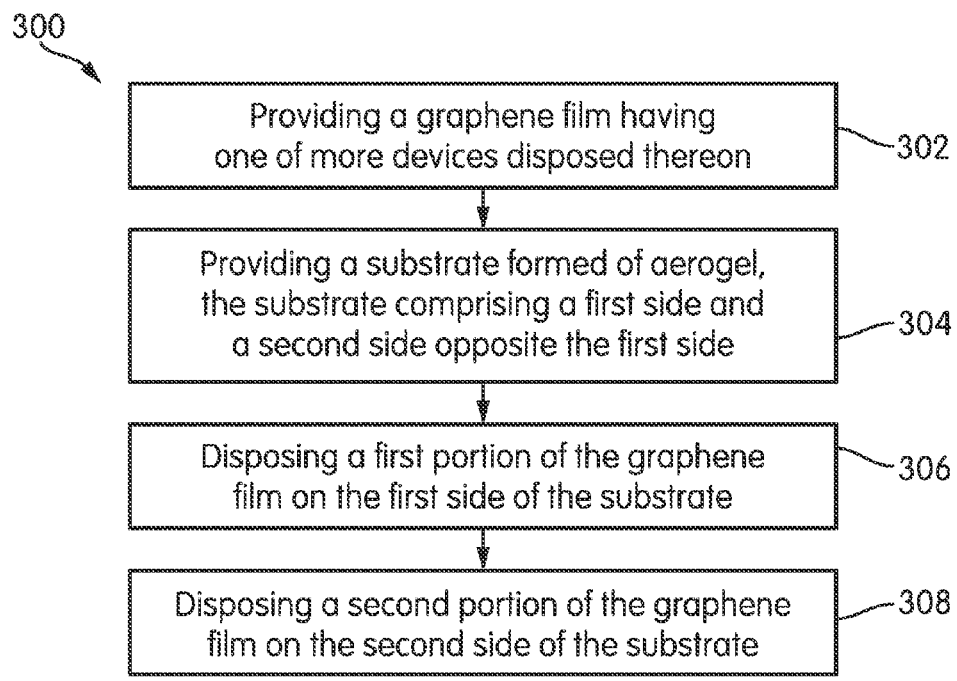
FIG. 19 is a process for forming a circuit board, shown according to an exemplary embodiment.

Referring to FIG. 19, a flowchart of a process 300 for forming a circuit board is shown, according to an exemplary embodiment. Process 300 is shown to include the steps of providing a graphene film having one or more devices disposed thereon (step 202), providing a substrate formed of aerogel, the substrate comprising a first side and a second side opposite the first side (step 304), disposing a first portion of the graphene film on the first side of the substrate (step 306), and disposing a second portion of the graphene film on the second side of the substrate (step 308).

The construction and arrangement of the elements of the graphene-aerogel systems and methods as shown in the exemplary embodiments are illustrative only. Although only a few embodiments have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. It should be noted that the elements and assemblies may be constructed from any of a wide variety of materials that provide sufficient strength or durability, in any of a wide variety of colors, textures, and combinations. Additionally, in the subject description, the word "exemplary" is used to mean serving as an example, instance or illustration. Any embodiment or design described herein as "exemplary" is not necessarily to be construed as preferred or advantageous over other embodiments or designs. Rather, use of the word exemplary is intended to present concepts in a concrete manner. Accordingly, all such modifications are intended to be included within the scope of the present inventions. Other substitutions, modifications, changes, and omissions may be made in the design, operating conditions, and arrangement of the preferred and other exemplary embodiments without departing from the spirit of the appended claims.

The order or sequence of any process or method steps may be varied or re-sequenced according to alternative embodiments. Also two or more steps may be performed concurrently or with partial concurrence. Any means-plus-function clause is intended to cover the structures described herein as performing the recited function and not only structural equivalents but also equivalent structures. Other substitutions, modifications, changes and omissions may be made in the design, operating configuration, and arrangement of the preferred and other exemplary embodiments without departing from the spirit of the appended claims.

What is claimed is:

1. A method of preserving electronic properties in a mechanically supported graphene sheet, comprising:
   providing a substrate formed of aerogel;
   providing a graphene film comprising one or more devices disposed thereon;
   providing at least one support structure at a lateral edge of the graphene film; and
   disposing the graphene film on the substrate.

2. The method of claim 1, wherein the one or more devices comprises a photonic circuit.

3. The method of claim 1, wherein the one or more devices comprises a plasmonic circuit.

4. The method of claim 1, wherein the one or more devices comprises an electronic circuit.

5. The method of claim 1, wherein the one or more devices comprises an integrated circuit.

6. The method of claim 1, wherein the one or more devices comprises a microelectromechanical device.

7. The method of claim 1, wherein the graphene film comprises a monolayer of graphene.

8. The method of claim 1, further comprising disposing a second graphene film on the substrate.

9. The method of claim 1, wherein the aerogel substrate comprises a first substantially homogeneous surface disposed adjacent the graphene film.

10. The method of claim 1, wherein the aerogel substrate comprises a first substantially structured surface disposed adjacent the graphene film.

11. The method of claim 1, wherein the aerogel substrate comprises a surface layer and a bulk layer, and wherein the properties of the surface layer differ from the properties of the bulk layer.

12. The method of claim 1, wherein the aerogel substrate comprises a first substrate;
   further comprising disposing a second aerogel substrate on a side of the graphene film opposite the first substrate.

13. The method of claim 1, wherein the graphene film comprises a macroscopic film.

14. The method of claim 1, further comprising doping the graphene film with a non-carbon atom.

15. The method of claim 1, wherein the graphene film substantially defines a graphene plane; and
   further comprising doping the graphene film with a functional group extending out of the graphene plane.

16. The method of claim 1, further comprising bonding the graphene film to the substrate.

17. The method of claim 1, further comprising mechanically coupling the graphene film to the substrate.

18. A method of forming a circuit board, comprising:
   providing a graphene film having one or more devices disposed thereon;
   providing a substrate formed of aerogel, the substrate comprising a first side and a second side opposite the first side;

disposing a first portion of the graphene film to the first side of the substrate;

folding the graphene film over the substrate; and disposing a second portion of the graphene film on the second side of the substrate.

19. The method of claim 18, wherein the one or more devices comprises a photonic circuit.

20. The method of claim 18, wherein the one or more devices comprises a plasmonic circuit.

21. The method of claim 18, wherein the one or more devices comprises an electronic circuit.

22. The method of claim 18, wherein the one or more devices comprises an integrated circuit.

23. The method of claim 18, wherein the aerogel substrate comprises a first substrate; and further comprising: providing a second substrate formed of aerogel, the second substrate comprising a first side and a second side opposite the first side; and disposing the first side of the second substrate on the first portion of the graphene film opposite the first substrate; and disposing a third portion of the graphene film on the second side of the second substrate.

24. A method of preserving electronic properties in a mechanically supported graphene sheet, comprising:

providing a substrate formed of aerogel, wherein the aerogel substrate comprises a surface layer and a bulk layer, and wherein the properties of the surface layer differ from the properties of the bulk layer;

providing a graphene film comprising one or more devices disposed thereon; and disposing the graphene film on the substrate.

25. The method of claim 24, wherein the one or more devices comprises a photonic circuit.

26. The method of claim 24, wherein the one or more devices comprises a plasmonic circuit.

27. The method of claim 24, wherein the one or more devices comprises an electronic circuit.

28. The method of claim 24, wherein the one or more devices comprises an integrated circuit.

29. The method of claim 24, wherein the one or more devices comprises a microelectromechanical device.

30. The method of claim 24, wherein the graphene film comprises a monolayer of graphene.

31. The method of claim 24, further comprising disposing a second graphene film on the substrate.

32. The method of claim 24, wherein the aerogel substrate comprises a first substantially homogeneous surface disposed adjacent the graphene film.

33. The method of claim 24, wherein the aerogel substrate comprises a first substantially structured surface disposed adjacent the graphene film.

34. The method of claim 24, wherein the aerogel substrate comprises a first substrate;

further comprising disposing a second aerogel substrate on a side of the graphene film opposite the first substrate.

35. The method of claim 24, wherein the graphene film comprises a macroscopic film.

36. The method of claim 24, further comprising doping the graphene film with a non-carbon atom.

37. The method of claim 24, wherein the graphene film substantially defines a graphene plane; and further comprising doping the graphene film with a functional group extending out of the graphene plane.

38. The method of claim 24, further comprising bonding the graphene film to the substrate.

39. The method of claim 24, further comprising mechanically coupling the graphene film to the substrate.

* * * * *